United States Patent
Nomoto

(10) Patent No.: US 12,146,696 B2
(45) Date of Patent: Nov. 19, 2024

(54) COOLING DEVICE, SEMICONDUCTOR MANUFACTURING APPARATUS, AND SEMICONDUCTOR MANUFACTURING METHOD

(71) Applicant: CANON KABUSHIKI KAISHA, Tokyo (JP)

(72) Inventor: Makoto Nomoto, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 98 days.

(21) Appl. No.: 17/355,345

(22) Filed: Jun. 23, 2021

(65) Prior Publication Data

US 2021/0404711 A1    Dec. 30, 2021

(30) Foreign Application Priority Data

Jun. 26, 2020   (JP) .................. 2020-110821

(51) Int. Cl.
*F25B 6/04*         (2006.01)
*F25B 39/04*        (2006.01)
(Continued)

(52) U.S. Cl.
CPC ............... *F25B 6/04* (2013.01); *F25B 39/04* (2013.01); *F25B 41/20* (2021.01); *F25B 49/022* (2013.01);
(Continued)

(58) Field of Classification Search
CPC .. F25B 6/04; F25B 41/20; F25B 39/04; F25B 49/022; F25B 2400/0403; F25B 2600/2513; F25B 2600/2515; F25B 2700/195; F25B 2700/2116; F25B 25/005; F25B 2700/2111; F25B 2313/008; F25B 7/00;
(Continued)

(56) References Cited

U.S. PATENT DOCUMENTS

| 8,610,089 B2 | 12/2013 | Donders |
| 2002/0066283 A1 | 6/2002 | Oh et al. |

(Continued)

FOREIGN PATENT DOCUMENTS

| CN | 101449115 A | 6/2009 |
| CN | 102749809 A | 10/2012 |

(Continued)

OTHER PUBLICATIONS

JP-6053907-B1 English Translation (Year: 2016).*

(Continued)

*Primary Examiner* — David J Teitelbaum
*Assistant Examiner* — Devon Moore
(74) *Attorney, Agent, or Firm* — ROSSI, KIMMS & McDOWELL LLP

(57) ABSTRACT

A cooling device includes a circulation system configured to circulate a refrigerant in a condenser so as to return the refrigerant to the condenser via a pump, a heater, a throttle valve, and a vaporizer; and a cooling system that includes a heat exchanger arranged in the condenser. The condenser includes a first portion where the refrigerant is present in a liquid state and a second portion where the refrigerant is present in a gas state, and at least a portion of the heat exchanger is arranged in the second portion.

21 Claims, 8 Drawing Sheets

(51) Int. Cl.
  *F25B 41/20* (2021.01)
  *F25B 49/02* (2006.01)
  *H01J 37/32* (2006.01)

(52) U.S. Cl.
  CPC ............... *F25B 2400/0403* (2013.01); *F25B 2600/2513* (2013.01); *F25B 2600/2515* (2013.01); *F25B 2700/195* (2013.01); *F25B 2700/2116* (2013.01); *H01J 37/32798* (2013.01); *H01J 2237/002* (2013.01)

(58) Field of Classification Search
  CPC .......... H01J 37/32798; H01J 2237/002; H05K 7/2029; H05K 7/20354; H05K 7/20381
  See application file for complete search history.

(56) References Cited

U.S. PATENT DOCUMENTS

| | | | |
|---|---|---|---|
| 2004/0261439 A1 | 12/2004 | Wayburn et al. | |
| 2012/0267550 A1 | 10/2012 | Donders et al. | |
| 2015/0128621 A1* | 5/2015 | Bowlsbey | H01J 7/24 62/298 |
| 2015/0135752 A1* | 5/2015 | Sugimoto | F25B 7/00 62/222 |
| 2016/0265838 A1* | 9/2016 | Nakamura | F25B 25/005 |
| 2016/0284521 A1* | 9/2016 | Miyagawa | H01J 37/32449 |
| 2020/0117762 A1 | 4/2020 | Haprian et al. | |
| 2021/0140685 A1* | 5/2021 | Yamawaki | F25B 7/00 |
| 2022/0221202 A1* | 7/2022 | Yamada | F25B 5/04 |

FOREIGN PATENT DOCUMENTS

| | | | | |
|---|---|---|---|---|
| CN | 105890268 A | | 8/2016 | |
| CN | 108701668 A | * | 10/2018 | ............. F28F 27/02 |
| EP | 3358274 A2 | * | 8/2018 | ............ F25B 15/025 |
| JP | 2002048422 A | | 2/2002 | |
| JP | 3576938 B2 | | 10/2004 | |
| JP | 2007155316 A | | 6/2007 | |
| JP | 2011196607 A | | 10/2011 | |
| JP | 5313384 B2 | | 10/2013 | |
| JP | 6053907 B1 | * | 12/2016 | ............. F24F 11/89 |
| KR | 1020040102033 A | | 12/2004 | |
| TW | 200305925 A | | 11/2003 | |
| TW | 200712849 A | | 4/2007 | |
| WO | WO-2017133773 A1 | * | 8/2017 | ............ F25B 41/062 |
| WO | WO-2020117762 A1 | * | 6/2020 | ............. B01D 53/02 |

OTHER PUBLICATIONS

CN-108701668-A English Translation (Year: 2018).*
NPL-1: HVAC Buddy R-410A (Year: 2019).*
Liquids and Gases—Boiling Points, NPL-2 (Year: 2006).*
Use of Nitrogen Generator in Refrigerant and HVAC Industry, NPL-3 (Year: 2014).*
Extended European Search Report issued in European Appln. No. 21177371.8 mailed on Dec. 7, 2021.
Office Action issued in Chinese Appln. No. 202110695168.9, mailed Jul. 11, 2023. English translation provided.
Communication Pursuant to Article 94(3) EPC issued in European Appln. No. 21177371.8, mailed Oct. 18, 2023.

* cited by examiner

COOLING DEVICE, SEMICONDUCTOR MANUFACTURING APPARATUS, AND SEMICONDUCTOR MANUFACTURING METHOD

BACKGROUND OF THE INVENTION

Field of the Invention

The present invention relates to a cooling device, a semiconductor manufacturing apparatus, and a semiconductor manufacturing method.

Description of the Related Art

A semiconductor manufacturing apparatus such as a pattern formation apparatus such as an exposure apparatus, an imprint apparatus, or an electronic beam lithography apparatus or a plasma processing apparatus such as a CVD apparatus, an etching apparatus, or a sputtering apparatus can include a driving mechanism or a heat generating portion such as a member that is heated by plasma. To cool the heat generating portion, the semiconductor manufacturing apparatus can include a cooling device. The cooling device cools the heat generating portion by depriving heat from the heat generating portion and exhausting the heat outside the apparatus.

Japanese Patent No. 5313384 discloses a cooling system including an evaporator that extracts heat from a component, a condenser, a pump, an accumulator, a heat exchanger, and a temperature sensor. A circuit is constituted to return a fluid from the pump via the evaporator and the condenser to the pump. The accumulator communicates the fluid to the circuit. The heat exchanger transfers heat from the fluid in the accumulator and transfers heat to the fluid in the accumulator. The amount of heat is controlled based on an output from the temperature sensor.

In the cooling system disclosed in Japanese Patent No. 5313384, the circuit is constituted to return a fluid from the pump via the evaporator and the condenser to the pump. To stably circulate the fluid, it is necessary to avoid cavitation at a pump suction portion. A cooling system is therefore added to the condenser or on its downstream or upstream side to decrease the fluid temperature at the pump suction portion or to increase the pressure. Since the fluid is pressurized at the outlet of the pump, the fluid is sent to the heat generating portion in a state in which it is hard to vaporize. At the heat generating portion, evaporative cooling is not done until the temperature of the fluid rises to the boiling point under the fluid pressure of the heat generating portion. Hence, temperature fluctuations of the heat generating portion will be allowed during this period until evaporative cooling occurs, and members around the heat generating portion may deform due to thermal expansion. To suppress the temperature fluctuations, the boiling point is controlled by changing the vapor-liquid equilibrium of the fluid by heat amount control to the accumulator and changing the pressure of the whole system so that the downstream side of the heat generating portion achieves a predetermined temperature using a vapor-liquid two-phase fluid accumulator.

In the arrangement disclosed in Japanese Patent No. 5313384, when heat is generated in the heat generating portion, heat is recovered from the accumulator to condense the fluid and decrease the pressure of the circulation system. However, the pressure of the pump suction portion also drops and the risk of cavitation rises. On the other hand, when no heat is generated in the heat generating portion, heat is supplied to the accumulator to vaporize the fluid and increase the pressure of the circulation system. However, to make the heat balance of the circulation system, it is necessary to perform cooling heat amount control of the fluid by the condenser or the cooling system, or to separately provide a heating means and perform heat generation amount control. This may complicate the arrangement and the control method.

Furthermore, in a condensation control system, since there are two outputs constituted by the condenser and the accumulator with respect to one input constituted by a temperature sensor in the control system, mutual interference may occur between the operation amount and the control amount, and control may be destabilized. A function that can cancel the interference needs to be added to avoid such a state. This may further complicate the arrangement and cause a delay in the control. Hence, it may become impossible to quickly follow fluctuations in the heat generating state of the heat generating portion, and the boiling point may fluctuate due to pressure fluctuation. As a result, the temperature stability may degrade.

SUMMARY OF THE INVENTION

The present invention provides a cooling device advantageous in performing stable control by a simple arrangement.

The first aspect of the present invention provides a cooling device. The device can comprise: a circulation system configured to circulate a refrigerant in a condenser so as to return the refrigerant to the condenser via a pump, a heater, a throttle valve, and a vaporizer; and a cooling system that includes a heat exchanger arranged in the condenser. The condenser can include a first portion where the refrigerant is present in a liquid state and a second portion where the refrigerant is present in a gas state, and at least a portion of the heat exchanger is arranged in the second portion.

The second aspect of the present invention provides a semiconductor manufacturing apparatus that includes a heat generating portion. The apparatus comprises a cooling device as defined as the first aspect of the invention. The cooling device can be configured to cool the heat generating portion by vaporizing a refrigerant in a vaporizer by heat from the heat generating portion.

The third aspect of the present invention provides a semiconductor manufacturing method comprising: processing a substrate by a semiconductor manufacturing apparatus as defined as the second aspect of the present invention; and processing the substrate processed in the processing.

Further features of the present invention will become apparent from the following description of exemplary embodiments with reference to the attached drawings.

DESCRIPTION OF THE EMBODIMENTS

Figure 1:
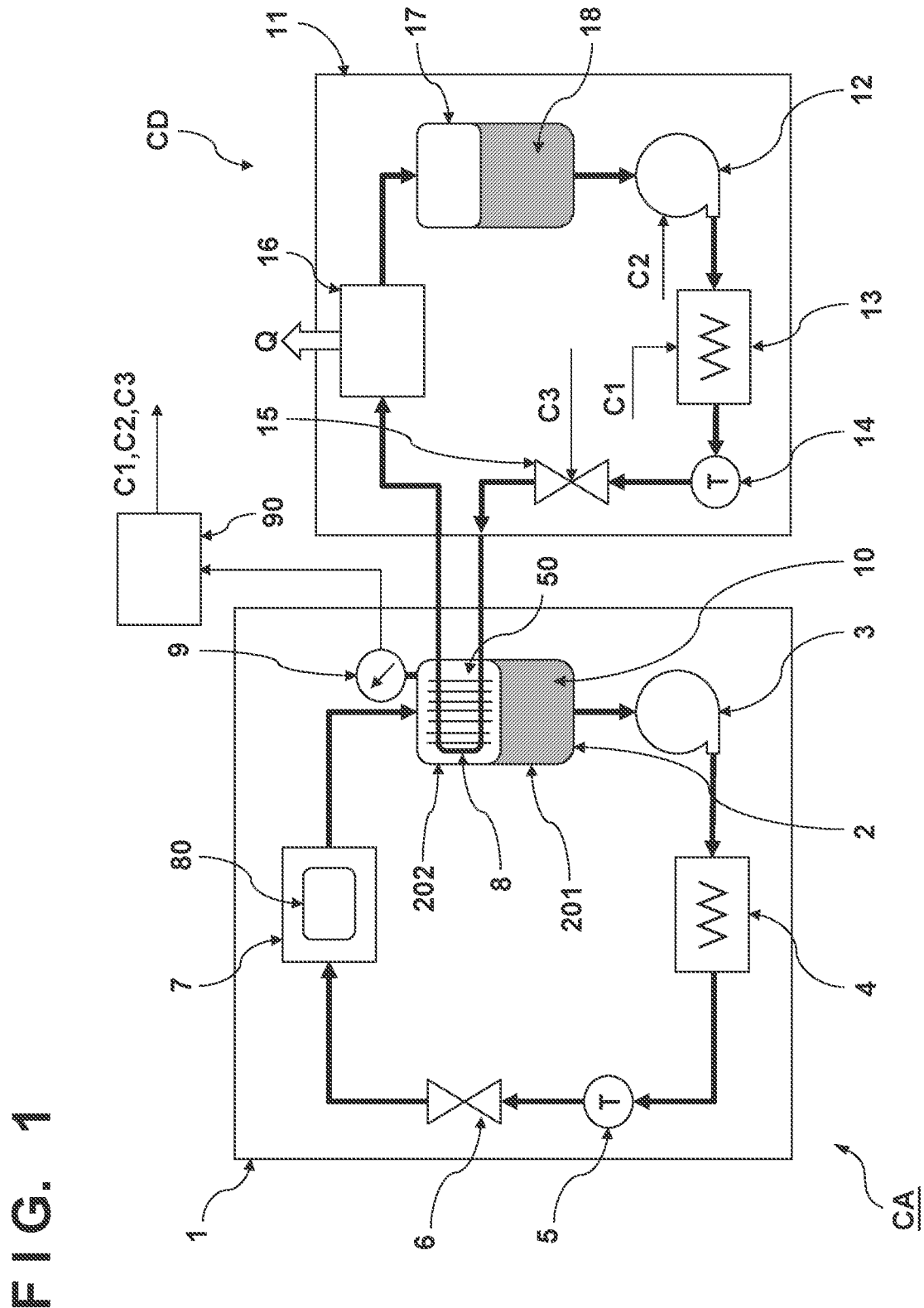
FIG. 1 is a view showing the arrangement of a cooling device according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 shows the arrangement of a cooling device according to the first embodiment. A cooling target of the cooling device CA is not limited to a particular target and can be, for example, a semiconductor manufacturing apparatus and especially the heat generating portion of the semiconductor manufacturing apparatus. The semiconductor manufacturing apparatus can be a pattern formation apparatus such as an exposure apparatus, an imprint apparatus, or an electronic beam lithography apparatus, or a plasma processing apparatus such as a CVD apparatus, an etching apparatus, or a sputtering apparatus. The pattern formation apparatus includes a driving mechanism that quickly moves a component such as a substrate and/or an original. The driving mechanism generates heat along with driving of an article and can become a heat generating portion. In the plasma processing apparatus, a component such as an electrode is heated by plasma and the component can become a heat generating portion.

The cooling device CA can include a first circulation system 1 which circulates a first refrigerant 10 in a condenser 2 via a pump 3, a heater 4, a throttle valve 6, and a vaporizer 7 so as to return the first refrigerant 10 to the condenser 2, and a cooling system CD which includes a heat exchanger 8 arranged in the condenser 2. The condenser 2 includes a first portion 201 where the first refrigerant 10 is present in a liquid state and a second portion 202 where the first refrigerant 10 is present in a gas state. At least a part of the heat exchanger 8 (more preferably, the entire heat exchanger 8) can be arranged in the second portion 202. A cooling target 80 such as a heat generating portion or the like can be cooled by the vaporizer 7.

The first circulation system 1 can be configured to cool the cooling target 80 by using the phase change of the first refrigerant 10. In addition to the pump 3, the heater 4, the throttle valve 6, and the vaporizer 7, the first circulation system 1 can also include, for example, a temperature sensor 5. Although the temperature sensor 5 is arranged between the heater 4 and the throttle valve 6 in FIG. 1, it may be arranged between the throttle valve 6 and the vaporizer 7. The first circulation system 1 can be a hermetic circulation system. The first refrigerant 10 stored in a liquid phase (liquid state) in the first portion 201 of the condenser 2 can be supplied to the heater 4 by the pump 3. The heater 4 can heat or thermally regulate the first refrigerant 10 so that the temperature of the first refrigerant 10 to be detected by the temperature sensor 5 arranged downstream will be a predetermined temperature. The heater 4 can include, for example, an electric heater or a heat exchanger, but is not limited to it.

The first refrigerant 10 that has been heated or thermally regulated to a predetermined temperature can be decompressed by the throttle valve 6 to a saturated vapor pressure of the first refrigerant 10 of the predetermined temperature, and be supplied to the vaporizer 7. The vaporizer 7 can thermally contact the cooling target 80 or incorporate the cooling target 80. When the cooling target 80 generates heat, the cooling target 80 can be cooled by the latent heat of vaporization from the first refrigerant 10 boiling inside the vaporizer 7. The first refrigerant 10 that passed through the vaporizer 7 can be returned in a liquid phase state or in a vapor-liquid multiphase state (a state including liquid and gas) to the condenser 2 in accordance with the heat generation state of the cooling target 80.

The heat exchanger 8, which is at least partially arranged in the second portion 202 in the condenser 2, cools the first refrigerant 10, and the first refrigerant 10 in the vapor phase state is thereby condensed into the first refrigerant 10 in the liquid phase state. The cooling system CD including the heat exchanger 8 can be formed by, for example, a second circulation system 11 that circulates a second refrigerant 18 through the heat exchanger 8. The second circulation system 11 circulates the second refrigerant 18 independent of the circulation of the first refrigerant 10 by the first circulation system 1. The cooling device CA can include a sensor 9 for detecting the pressure or the temperature inside (the second portion 202) the condenser 2. A gas 50 of a predetermined amount can be sealed inside the condenser 2. The gas 50 can be a gas that has a lower boiling point than the first refrigerant 10 and will not chemically react with the first refrigerant 10. The gas 50 may be, for example, air or an inert gas such as nitrogen or the like.

The second circulation system 11 can be controlled based on the output from the sensor 9 so that the pressure or the temperature inside (the second portion 202) condenser 2 will be a predetermined pressure or a predetermined temperature. The boiling point of the first refrigerant 10 can be controlled here by performing control so that the pressure of the first refrigerant 10 in the vaporizer 7 will be a saturated vapor pressure of a predetermined temperature. In the case of heat-transfer fluid cooling, the temperature of a refrigerant will rise by only the amount of a value obtained by dividing a recovered heat amount by the heat capacity of the fluid. However, in the case of ebullient cooling, heat can be recovered at a predetermined temperature of the boiling point because heat will be recovered by the latent heat of vaporization.

If the first circulation system 1 is a hermetic system, the internal pressure of the vaporizer 7 and the condenser 2 will rise when the first refrigerant 10 boils (vaporizes). This means that the saturated vapor pressure of the first refrigerant 10 will rise, thereby bringing a change to the boiling point of an amount of dT as a temperature change represented by the Clausius-Clapeyron equation as follows.

$$dT = T \Delta V \cdot dP / L$$

where T is a state temperature, $\Delta V$ is a volume change accompanying evaporation, dP is a pressure change, and L is latent heat.

The gas 50 is sealed in the condenser 2 to maintain the first refrigerant 10, inside the vaporizer 7, at a predetermined temperature and a predetermined saturated vapor pressure. The amount of the gas 50 sealed in the condenser 2 is an amount at which the difference between the saturated vapor pressure of the first refrigerant 10 in the vaporizer 7 and the saturated vapor pressure of the first refrigerant 10 in the condenser 2 is equal to the partial pressure of the gas 50. If there is a height difference between the vaporizer 7 and the condenser 2, the pressure of the condenser 2 is decreased (increased if h has a negative value) by only the amount of a height hydraulic head ρgh, where ρ is a density of the first refrigerant 10, g is a gravitational acceleration, and h is a height of the vaporizer 7 based on the condenser 2 as a reference.

Control of the second circulation system 11 will be described. The second refrigerant 18 used in the second circulation system 11 can be, for example, a fluid such as water or the like. The second circulation system 11 can include a second pump 12, a second heater 13, a second temperature sensor 14, a flow rate regulating valve 15, the heat exchanger 8, a heat exhauster 16, and a tank 17. The second refrigerant 18 in the tank 17 can be supplied to the second heater 13 by the second pump 12. The second heater 13 can heat or thermally regulate the second refrigerant 18 so that the temperature of the second refrigerant 18 detected by the second temperature sensor 14, arranged downstream of the second heater 13, will be a predetermined temperature. The second refrigerant 18 that has been heated or thermally regulated to a predetermined temperature is regulated to a predetermined flow rate by a flow rate regulating valve 15 and supplied to the heat exchanger 8 to exchange heat with the first refrigerant 10. The first refrigerant 10 is cooled and condensed by the heat exchange with the second refrigerant 18. The heat of the second refrigerant 18 heated by the latent heat of condensation of the first refrigerant 10 can be exhausted outside the system by the heat exhauster 16 and be returned to the tank 17.

The cooling device CA can include a controller 90. The controller 90 can generate control signals C1, C2, and C3 so that the pressure or the temperature inside (the second portion 202) the condenser 2 of the first circulation system 1 will be constant, and control the second refrigerant 18 by the control signals C1, C2, and C3. The control of the second refrigerant 18 by the controller 90 can include controlling at least one of the temperature, the flow rate, and the pressure of the second refrigerant 18 to be supplied to the heat exchanger 8. The control of the second refrigerant 18 by the controller 90 can be understood to be an operation to control the condensation amount of the first refrigerant 10 in the heat exchanger 8. The control of the second refrigerant 18 by the controller 90 can include, for example, controlling the heating amount of the second refrigerant 18 by the second heater 13 by applying, to the second heater 13, the control signal C1 in correspondence with the output from the sensor 9. The control of the second refrigerant 18 by the controller 90 can include, for example, controlling the flow rate and/or the pressure of the second refrigerant 18 by controlling the output from the second pump 12 by applying, to the second pump 12, the control signal C2 in correspondence with the output from the sensor 9. The control of the second refrigerant 18 by the controller 90 can include, for example, controlling the flow rate and/or the pressure of the second refrigerant 18 by controlling the degree of opening of the flow rate regulating valve 15 by applying, to the flow rate regulating valve 15, the control signal C3 in correspondence with the output from the sensor 9. That is, the controller 90 can control at least one of the second pump 12 and the flow rate regulating valve 15 based on the output from the sensor 9.

According to the first embodiment, stable control is provided by implementing a simple control system in which the pressure or the temperature inside the condenser 2 of the first circulation system 1 serves as a single input and the condenser 2 serves as a single output. In addition, in the first embodiment, the cooling of the first refrigerant 10 by the second circulation system 11 is controlled so that the pressure or the temperature inside the condenser 2 will be a predetermined value by following the heat generation state of the cooling target 80. As a result, the boiling point of the first refrigerant 10 in the vaporizer 7 can be fixed, and the heat from the cooling target 80 can be recovered at a constant temperature. Furthermore, according to the first embodiment, pressure control and heat exhaustion control will be performed simultaneously in the condenser 2. Therefore, control delays will be reduced and the stability of temperature control will be improved.

Figure 2:
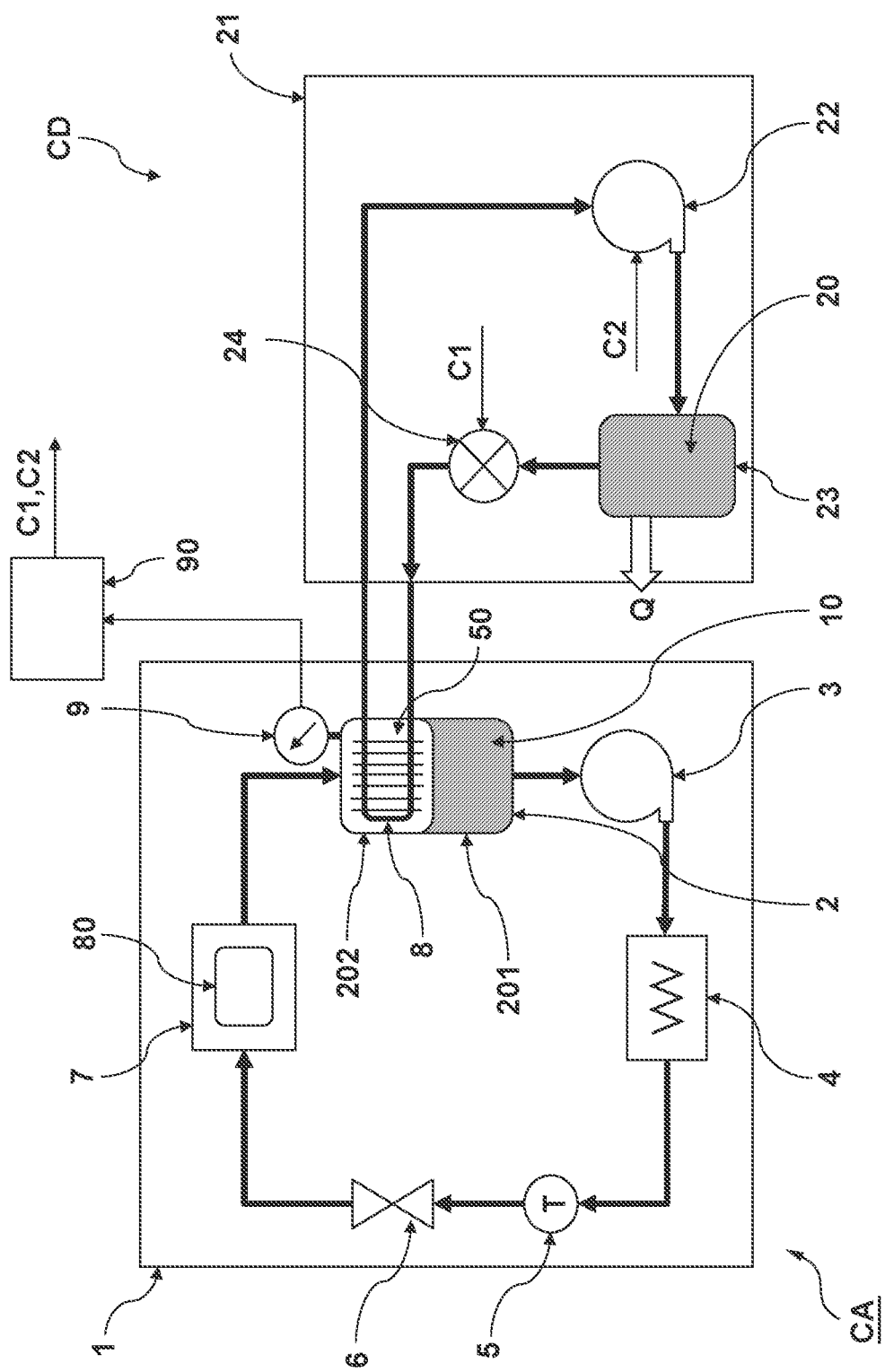
FIG. 2 is a view showing the arrangement of a cooling device according to the second embodiment.

FIG. 2 shows the arrangement of a cooling device CA according to the second embodiment. In the cooling device CA according to the second embodiment, the arrangement of a cooling system CD differs from the arrangement of the cooling system CD of the first embodiment. Matters not mentioned in the second embodiment can follow those of the first embodiment. The cooling system CD according to the second embodiment can be formed by a second circulation system 21. The second circulation system 21 can circulate a second refrigerant 20 independent of the circulation of a first refrigerant 10 in a first circulation system 1. The second circulation system 21 can be, for example, a hermetic circulation system that includes a compressor 22, a second condenser 23, an expansion valve 24, a heat exchanger (vaporizer) 8.

The second refrigerant 20 in a vapor phase state is compressed by the compressor 22, supplied to the second condenser 23, and is changed into a liquid phase state upon being condensed by undergoing a heat exhaustion process in the second condenser 23. The second refrigerant 20 in the liquid phase is decompressed by the expansion valve 24 to almost a saturated vapor pressure and supplied to the heat exchanger 8. The heat exchanger 8 is formed as a vaporizer. The second refrigerant 20 undergoes a heat exchange process with the first refrigerant 10 in the heat exchanger 8, and the first refrigerant 10 is condensed by the latent heat of vaporization generated by the evaporation of the second refrigerant 20. The second refrigerant 20 that has been changed into the vapor phase state in the heat exchanger 8 is returned to the compressor 22.

Here, equilibrating the evaporation amount of the first refrigerant 10 in a vaporizer 7 and the condensation amount of the first refrigerant 10 in a condenser 2 will allow the pressure of the first refrigerant 10 to be maintained and the boiling point to be constant. Hence, a controller 90 will control, based on an output from a sensor 9 of the first circulation system 1, the cooling of the first refrigerant 10 by the second circulation system 21 so that the pressure or the temperature inside (a second portion 202) of the condenser 2 will be a predetermined value. To implement such control, the controller 90 can generate control signals C1 and C2 based on the output from the sensor 9 of the first circulation system 1 so that the pressure or the temperature inside (second portion 202) the condenser 2 of the first circulation system 1 will be constant, and control the second refrigerant 20 by the control signals C1 and C2. The control of the second refrigerant 20 by the controller 90 can include, for example, controlling at least one of the temperature, the flow rate, and the pressure of the second refrigerant 20 supplied to the heat exchanger 8. The control of the second refrigerant 20 by the controller 90 can be understood to be an operation to control the latent heat of vaporization of the second refrigerant 20 in the heat exchanger 8.

The control of the second refrigerant 20 by the controller 90 can include controlling the degree of opening of the expansion valve 24 by applying, to the expansion valve 24, the control signal C1 in correspondence with the output from the sensor 9. Alternatively or in addition to this control, the control of the second refrigerant 20 by the controller 90 can include controlling the compression of the second refrigerant 20 by the compressor 22 by applying, to the compressor 22, the control signal C2 in correspondence with the output from the sensor 9. That is, the controller 90 can control at least one of the compressor 22 and the expansion valve 24 based on the output from the sensor 9.

According to the second embodiment, the condensation of the first refrigerant 10 and the vaporization of the second refrigerant 20 are simultaneously performed in the condenser 2 of the first circulation system 1. As a result, the second circulation system 21 can transfer a large amount of heat by a low flow rate. In addition, according to the second embodiment, since heat is transferred by boiling or condensation heat transfer with good heat transfer efficiency, control delays can be improved.

Figure 3:
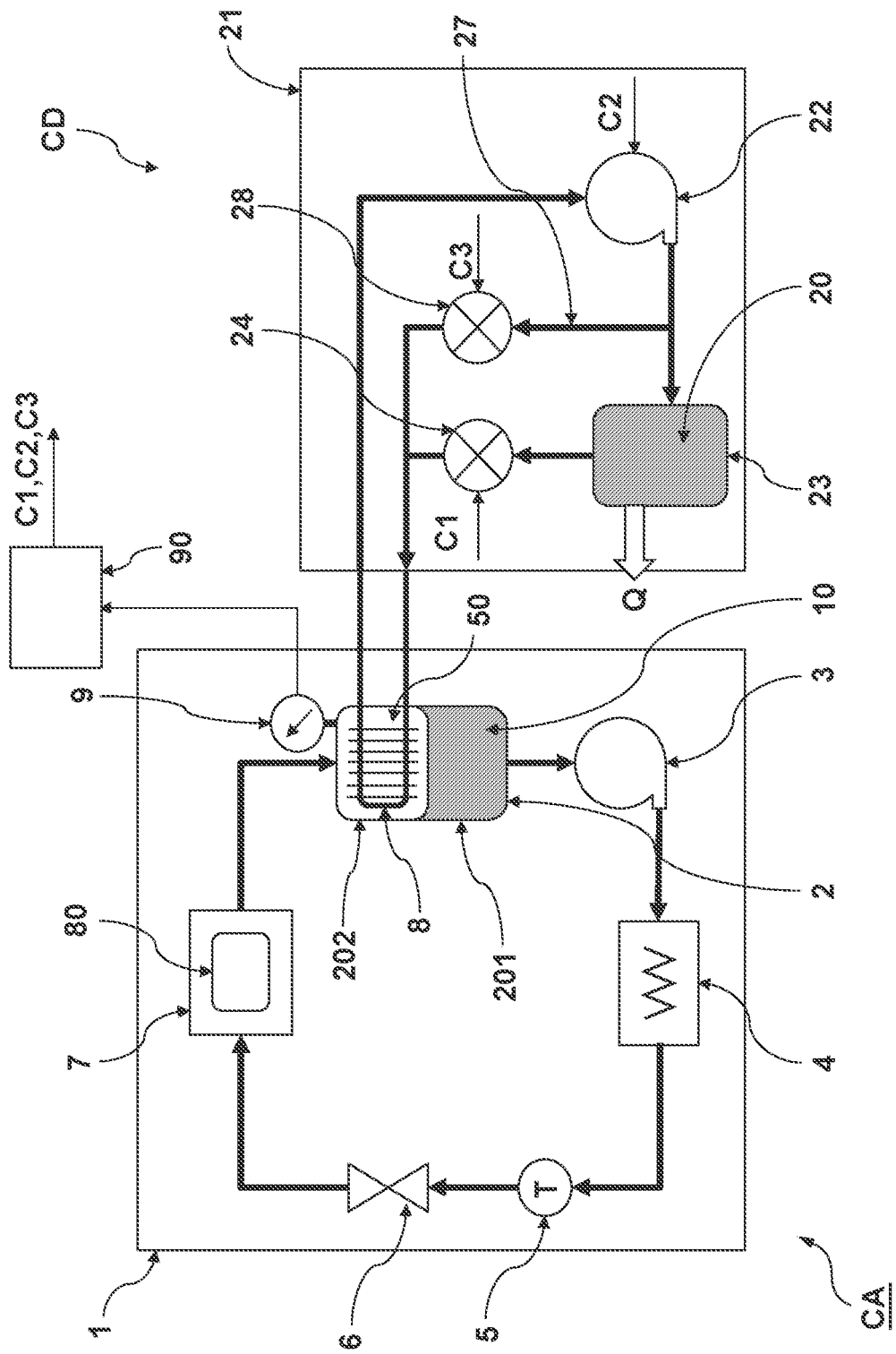
FIG. 3 is a view showing the arrangement of a cooling device according to the third embodiment.

FIG. 3 shows the arrangement of a cooling device CA according to the third embodiment. The cooling device CA according to the third embodiment is a modification of the cooling device CA of the second embodiment, and the arrangement of a cooling system CD differs from the cooling system CD of the second embodiment. Matters not mentioned in the third embodiment can follow those of the second embodiment.

In the third embodiment, a hot bypass path (bypass path) 27 has been added to a second circulation system 21. The hot bypass path 27 is arranged to bypass a main path from a compressor 22 to a heat exchanger 8 via a second condenser 23 and an expansion valve 24. The hot bypass path 27 branches from a channel between the compressor 22 and the second condenser 23 and merges with a channel between the expansion valve 24 and the heat exchanger 8. A regulating valve 28 can be arranged in the hot bypass path 27.

A second refrigerant 20 that passes through the hot bypass path 27 is not condensed (liquified) since it does not pass the second condenser 23. Hence, the second refrigerant 20 does not have the cooling ability generated by the latent heat of vaporization. A controller 90 can generate control signals C1, C2, and C3 for controlling the expansion valve 24, the compressor 22, and the regulating valve 28, respectively, so that the pressure or the temperature of a first refrigerant 10 in the heat exchanger 8 will be controlled to be a predetermined value, based on the output from a sensor 9 in a first circulation system 1. The controller 90 can use the control signals C1 and C3 to control a mixed amount of the second refrigerant 20 in a liquid phase with the cooling ability and the second refrigerant 20 in a high temperature vapor phase without the cooling ability.

According to the third embodiment, the cooling ability range of the second circulation system 21 can be expanded by regulating the cooling ability of the second refrigerant 20 based on the mixing ratio of the second refrigerant 20 in the liquid phase and the second refrigerant 20 in the vapor phase. Hence, the cooling device CA according to the third embodiment can also follow a large heat fluctuation in an apparatus, for example, a semiconductor manufacturing apparatus, which has a large heat exhaustion amount, and provide a good temperature stability.

Figure 4:
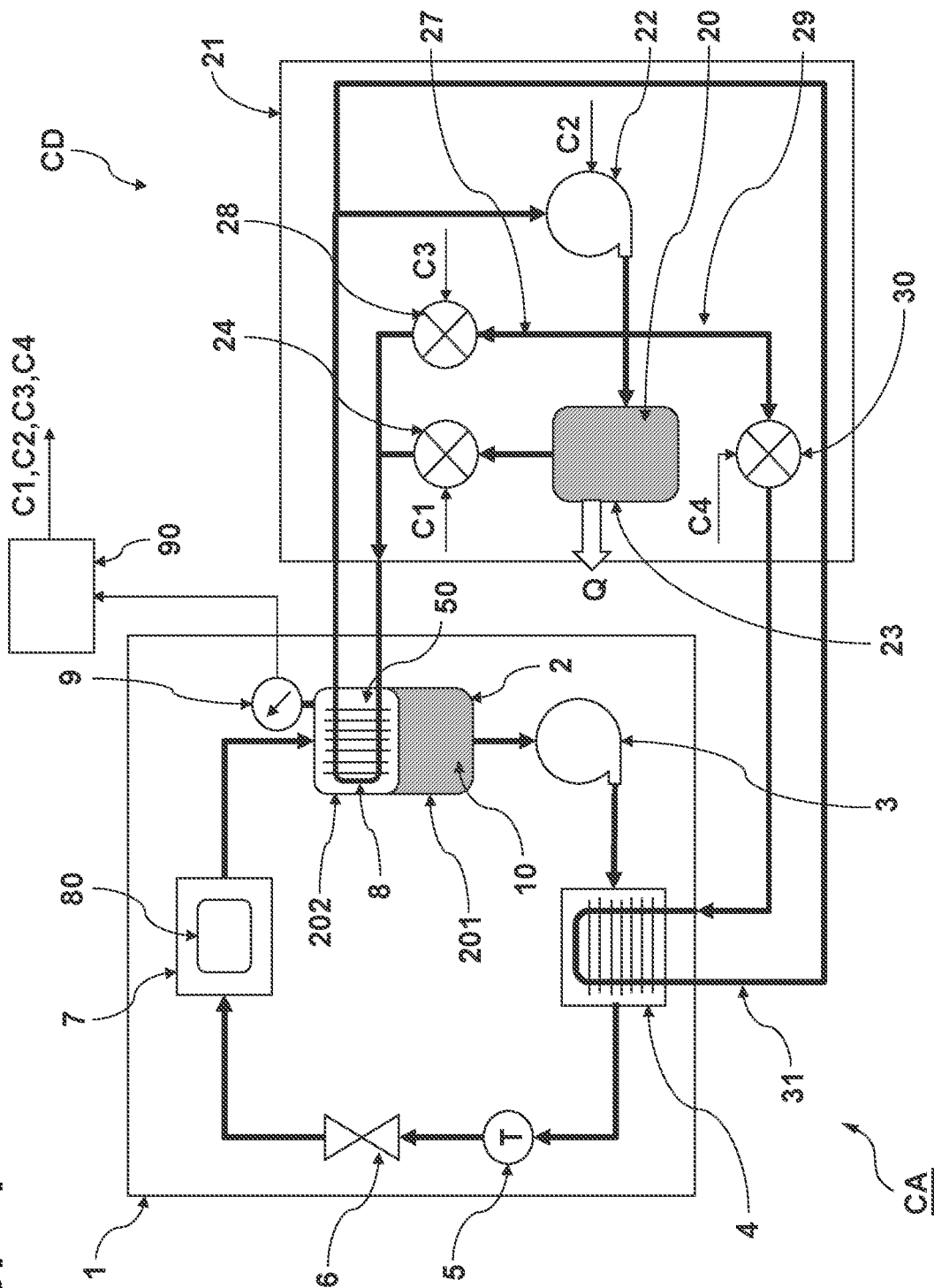
FIG. 4 is a view showing the arrangement of a cooling device according to the fourth embodiment.

FIG. 4 shows the arrangement of a cooling device CA according to the fourth embodiment. The cooling device CA according to the fourth embodiment is a modification of the cooling device CA of the third embodiment, and the arrangement of a cooling system CD differs from the arrangement of the cooling system CD of the third embodiment. Matters not mentioned in the fourth embodiment can follow those of the third embodiment.

In the fourth embodiment, a heater 4 is formed by a heat exchanger (second heat exchanger). In the cooling device CA, a third circulation path 31 that branches from a channel between a compressor 22 and a second condenser 23 and returns to the compressor 22 via the heater 4 (second heat exchanger) is arranged. A second regulating valve 30 can be arranged in the third circulation path 31.

A controller 90 can generate control signals C1, C2, and C3 for controlling an expansion valve 24, the compressor 22, and a regulating valve 28, respectively, so that the pressure or the temperature of a first refrigerant 10 inside a heat exchanger 8 will be a predetermined value based on an output from a sensor 9 of a first circulation system 1. In addition, the controller 90 can also generate a control signal C4 for controlling the second regulating valve 30 so that the temperature of the first refrigerant 10 detected by a temperature sensor 5 will be a predetermined value based on an output from the temperature sensor 5.

Figure 5:
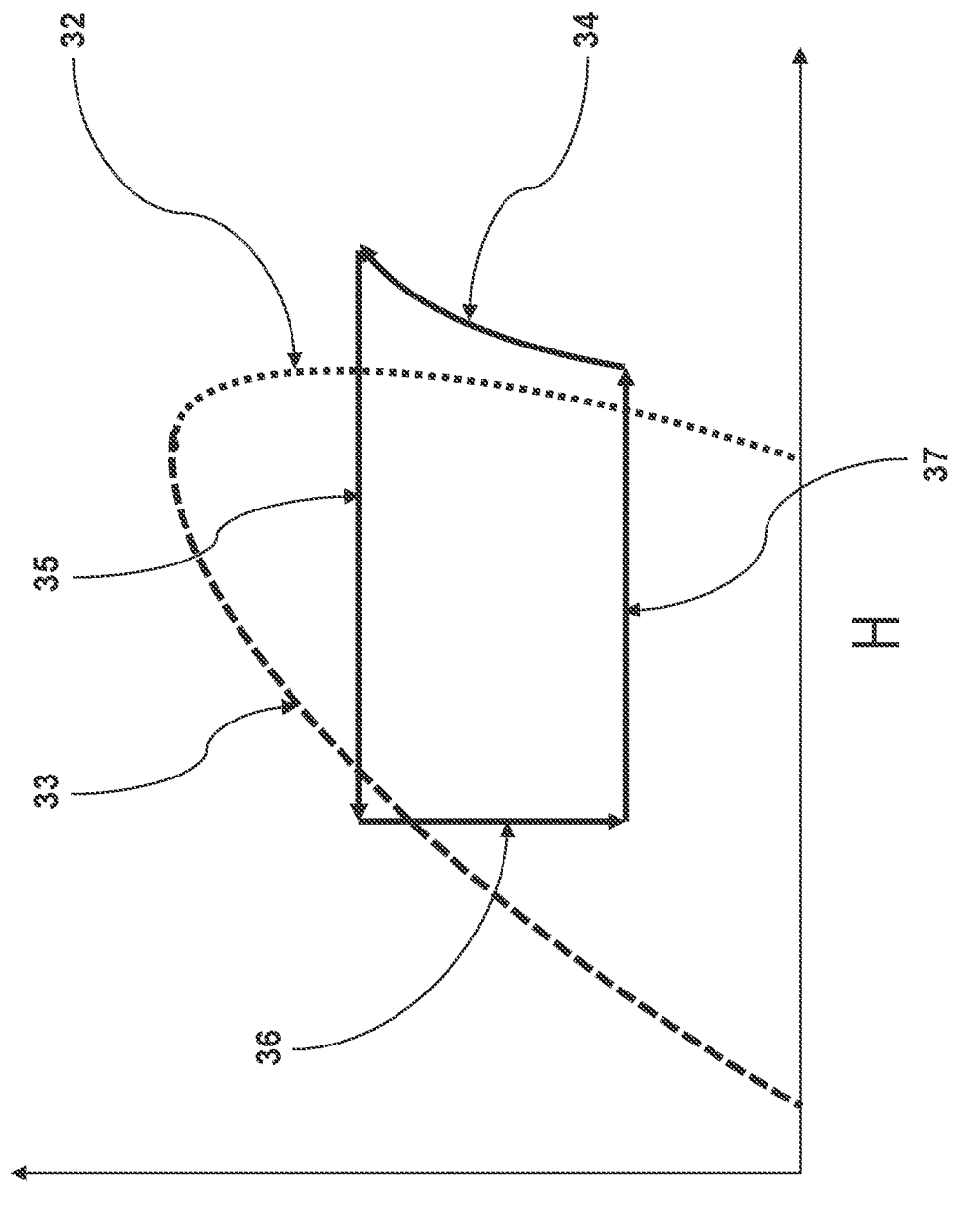
FIG. 5 is a Mollier diagram of an ideal refrigeration cycle.

FIG. 5 shows a Mollier diagram of an ideal refrigeration cycle. In FIG. 5, the abscissa represents an enthalpy H and the ordinate represents a pressure P. A region closer to the right side than a saturated vapor line 32 indicates a vapor phase, a region closer to the left side than a saturated liquid line 33 indicates a liquid phase, and a portion encircled by the saturated vapor line 32 and the saturated liquid line 33 indicates a wet state in a vapor-liquid phase. The second refrigerant 20 undergoes a cycle in which it is compressed by the compressor 22 in accordance with an isenthalpic line 34, cooled and condensed by the second condenser 23 in accordance with a constant high pressure line 35, decompressed by the expansion valve 24 in accordance with an isenthalpic line 36, and expands by vaporization by the heat exchanger 8 in accordance with a constant low pressure line 37.

The maximum heating amount of a refrigerant in a refrigeration cycle is an enthalpy difference between the two endpoints of the constant high pressure line 35, and this corresponds to the heating amount per unit mass by the second refrigerant 20 in the heater (heat exchanger) 4. In addition, an enthalpy difference between the two endpoints of the isenthalpic line 34 is the power of the compressor 22, and is normally $\frac{1}{4}$ to $\frac{1}{5}$ of the maximum heating amount. Hence, compared to a case in which the heater 4 is formed by an electric heater, the electrical power required for heating the first refrigerant 10 in the fourth embodiment can be reduced to, for example, approximately $\frac{1}{4}$ of the electrical power of such a case. Therefore, according to the fourth embodiment, energy consumption can be reduced because the energy required for heating the first refrigerant 10 can be reduced.

Figure 6:
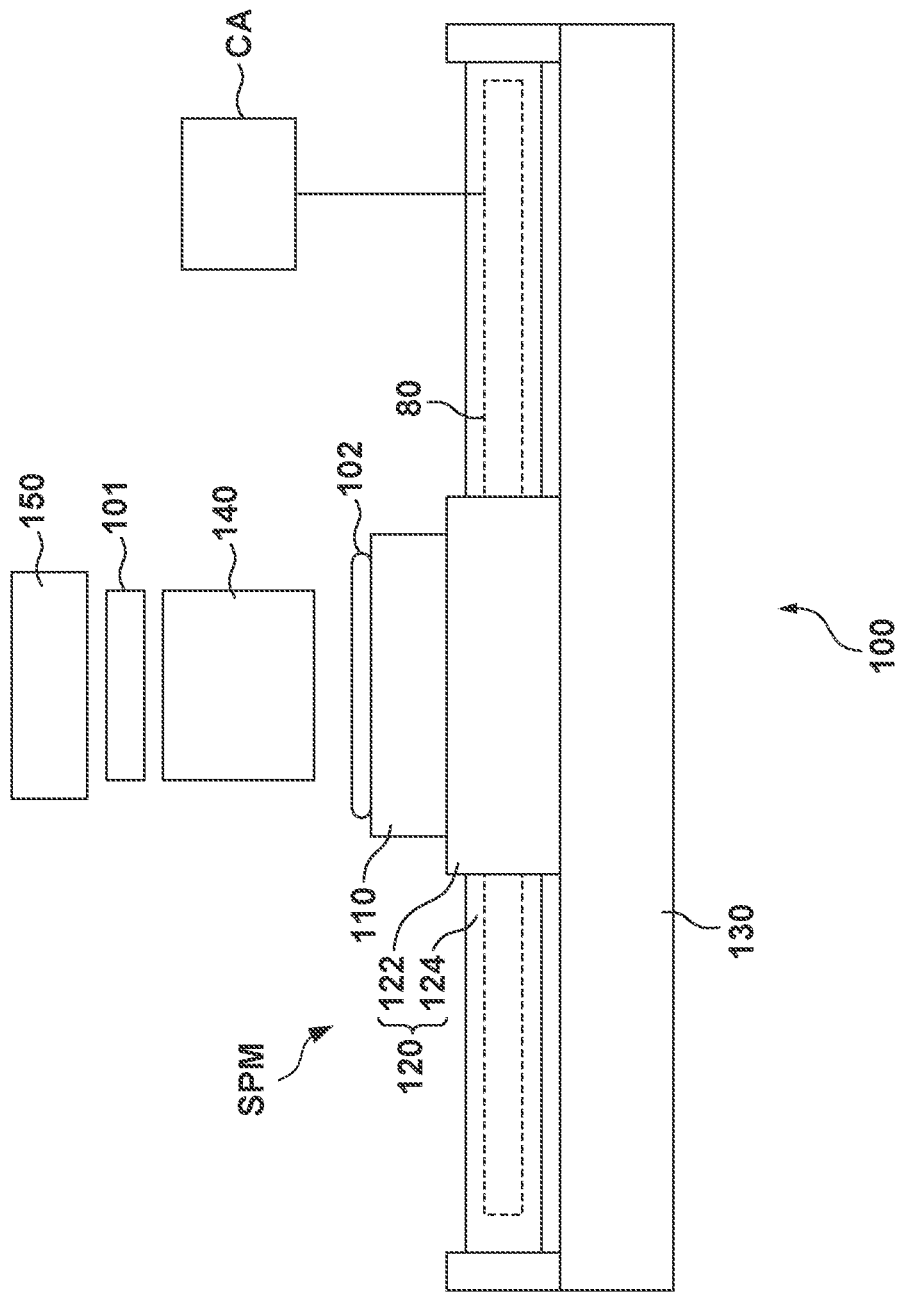
FIG. 6 is a view showing an example of the arrangement of a semiconductor manufacturing apparatus.

A semiconductor manufacturing apparatus to which the cooling device CA is applied will be exemplarily explained with reference to FIGS. 6, 7, and 8. FIG. 6 schematically shows the arrangement of an exposure apparatus 100 as an example of a semiconductor manufacturing apparatus, more specifically, a pattern formation apparatus. The exposure apparatus 100 can be configured to transfer the pattern of an original 101 through a projection optical system 140 to a photosensitive layer of a substrate 102 having the photosensitive layer. The exposure apparatus 100 can include an illumination optical system 150 that illuminates the original 101, the projection optical system 140, and a substrate positioning mechanism SPM. The exposure apparatus 100 can also include an original positioning mechanism (not shown) that positions the original 101. The substrate positioning mechanism SPM can include a substrate stage 110 having a substrate chuck that holds the substrate 102, a driving mechanism 120 that drives the substrate stage 110, and a base member 130 that supports the driving mechanism 120. The driving mechanism 120 can include an actuator including a mover 122 that moves together with the substrate stage 110, and a stator 124 fixed to the base member 130. The stator 124 can include a coil line as the cooling target 80. The cooling device CA can be configured to cool the coil line serving as the cooling target 80.

Figure 7:
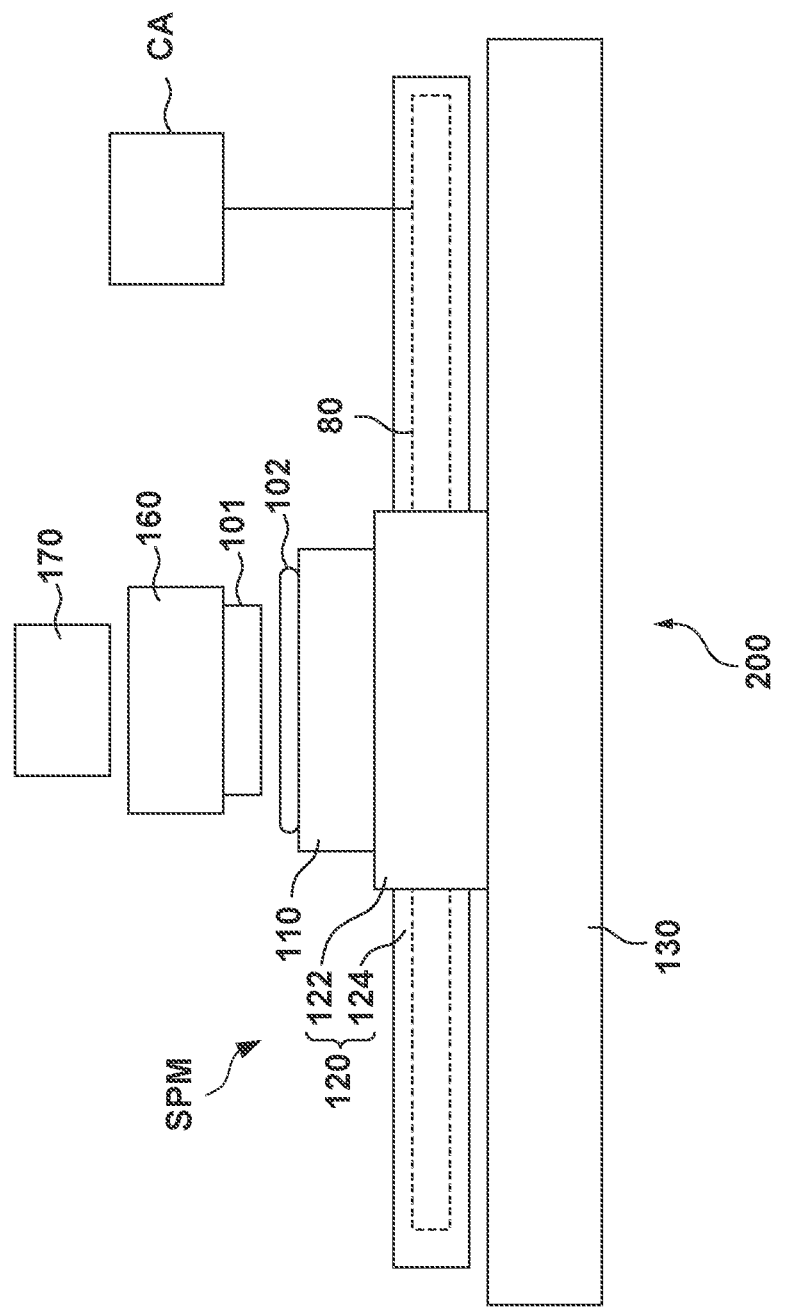
FIG. 7 is a view showing an example of the arrangement of the semiconductor manufacturing apparatus.

FIG. 7 schematically shows the arrangement of an imprint apparatus 200 as an example of a semiconductor manufacturing apparatus, more specifically, a pattern formation apparatus. The imprint apparatus 200 can be configured to transfer the pattern of an original 101 to an imprint material on a substrate 102. The imprint apparatus 200 can include an original driving mechanism 160 that drives the original 101, a substrate positioning mechanism SPM that drives the substrate 102, and a curing unit 170 that cures the imprint material on the substrate 102.

At least one of the original driving mechanism 160 and the substrate positioning mechanism SPM can align a shot region of the substrate 102 and a pattern region of the original 101. At least one of the original driving mechanism 160 and the substrate positioning mechanism SPM can bring an imprint material on the substrate 102 and a pattern region of the original 101 into contact with each other, and separate the imprint material and the pattern region. While the imprint material on the substrate 102 and the pattern region of the original 101 are in contact with each other, the curing unit 170 cures the imprint material. After that, the cured imprint material and the pattern region of the original 101 are separated. As a result, the pattern made of the cured imprint material is formed on the substrate 102. That is, the pattern region of the original 101 is transferred to the imprint material on the substrate 102.

The substrate positioning mechanism SPM can include the substrate stage 110 having a substrate chuck that holds the substrate 102, the driving mechanism 120 that drives the substrate stage 110, and the base member 130 that supports the driving mechanism 120. The driving mechanism 120 can include an actuator including the mover 122 that moves together with the substrate stage 110, and the stator 124 fixed to the base member 130. The stator 124 can include a coil line as the cooling target 80. The cooling device CA can be configured to cool the coil line serving as the cooling target 80.

Figure 8:
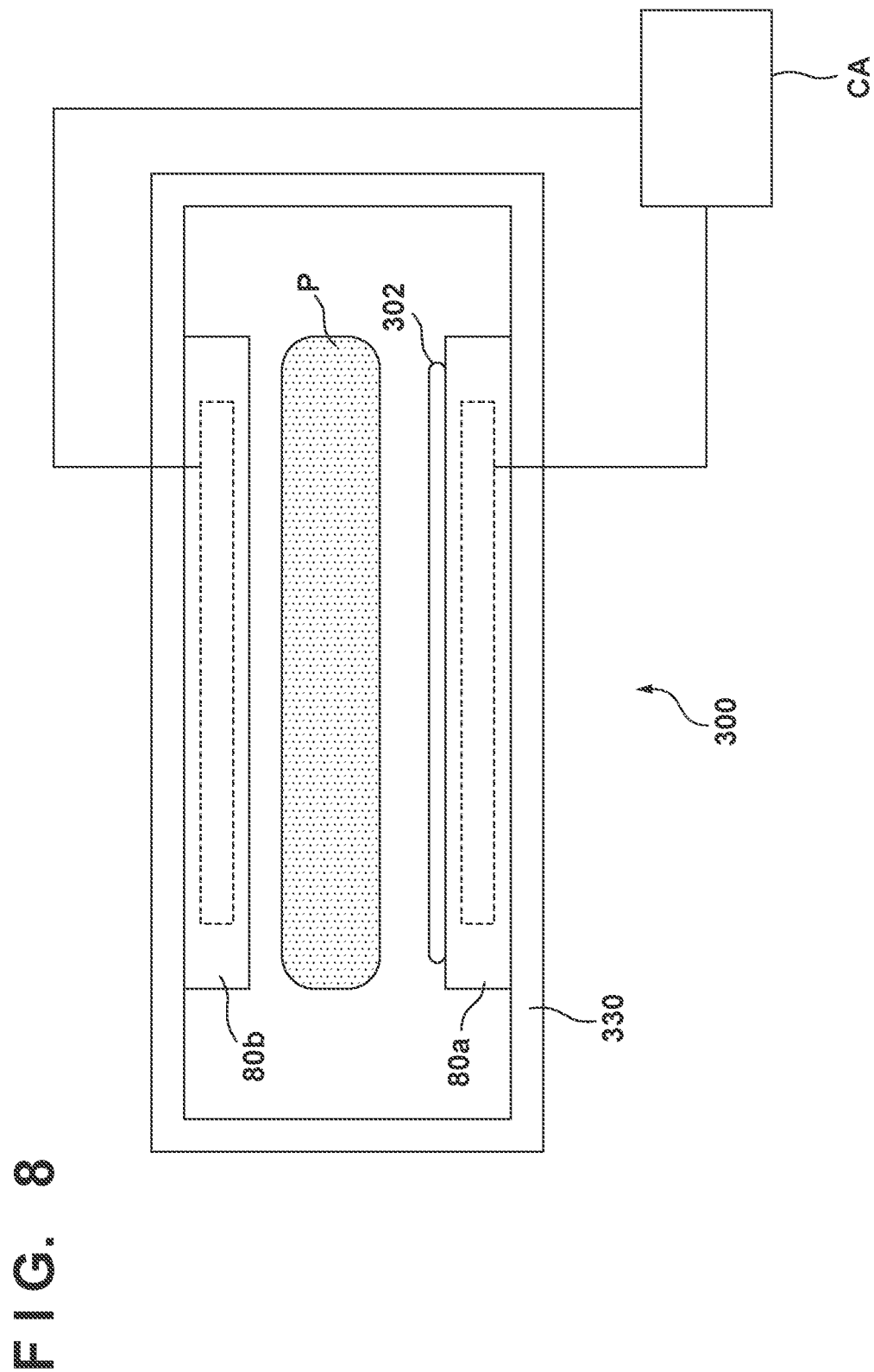
FIG. 8 is a view showing an example of the arrangement of the semiconductor manufacturing apparatus.

FIG. 8 schematically shows the arrangement of a plasma processing apparatus 300 as an example of a semiconductor manufacturing apparatus. The plasma processing apparatus 300 can be, for example, a CVD apparatus, an etching apparatus, or a sputtering apparatus. The plasma processing apparatus 300 can include a chamber 330, and an electrode structure serving as one or a plurality of cooling targets 80a and 80b arranged in the chamber 330. In the example of FIG. 8, a substrate 302 can be supported by the cooling target 80a. A gas for generating plasma can be supplied into the chamber 330. When the plasma processing apparatus 300 is constituted as a CVD apparatus, a deposition gas can be supplied into the chamber 330. When the plasma processing apparatus 300 is constituted as an etching apparatus, an etching gas can be supplied into the chamber 330. When the plasma processing apparatus 300 is constituted as a sputtering apparatus, a gas for generating plasma can be supplied into the chamber 330. A target can be attached to the electrode structure serving as the cooling target 80b. The cooling device CA can be configured to cool the cooling targets 80a and 80b.

A semiconductor manufacturing method as one aspect of the present invention can include a step of processing a substrate by a semiconductor manufacturing apparatus typified by the above-described exposure apparatus 100, imprint apparatus 200, and plasma processing apparatus 300, and a step of treating the substrate processed in the step. The step of processing a substrate by a semiconductor manufacturing apparatus can be, for example, a step of forming a pattern on a substrate, a step of forming a film on the substrate, or a step of etching the substrate or the film formed on it. The step of treating the substrate can be, for example, a step of forming a pattern on the substrate, a step of forming a film on the substrate, or a step of etching the substrate or the film formed on it. Alternatively, the step of treating the substrate can be a step of dividing (dicing) the substrate or a step of sealing the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-110821, filed Jun. 26, 2020, which is hereby incorporated by reference herein in its entirety.

What is claimed is:

1. A cooling device comprising:
 a circulation system having a condenser, a pump, a heater, a throttle valve, and a vaporizer connected to the condenser and arranged to cool a cooling target, the circulation system being configured to circulate a refrigerant in the condenser so as to return such that the refrigerant is drawn from the condenser by the pump and returned to the condenser while passing through the heater, the throttle valve and the vaporizer in this order; and
 a cooling system that includes a heat exchanger arranged in the condenser,
 wherein the condenser includes a first portion where the refrigerant is present in a liquid state and a second portion where the refrigerant in a gas state is present when the circulation system circulates the refrigerant such that the cooling target is cooled by the vaporizer, and at least a portion of the heat exchanger is arranged in the second portion, and
 wherein in the circulation system, the refrigerant is returned to the second portion of the condenser and the refrigerant in the first portion of the condenser is supplied to the pump.

2. The device according to claim 1, wherein the cooling system maintains one of a pressure and a temperature of the second portion at a predetermined value.

3. The device according to claim 1, wherein a second gas which has a lower boiling point than the refrigerant is sealed in the condenser.

4. The device according to claim 1, wherein the cooling system includes a second circulation system configured to circulate a second refrigerant through the heat exchanger.

5. The device according to claim 4, further comprising:
 a sensor configured to detect one of a pressure and a temperature of the second portion; and
 a controller configured to control the second refrigerant based on an output from the sensor.

6. The device according to claim 5, wherein the second circulation system further includes a second pump, a second heater, a flow rate regulating valve, a heat exhauster, and a tank, and the second refrigerant is supplied from the tank to the heat exchanger via the second pump and the second heater, and the second refrigerant is returned from the heat exchanger to the tank via the heat exhauster.

7. The device according to claim 6, wherein the controller controls at least one of a temperature, a flow rate, and a pressure of the second refrigerant based on the output from the sensor.

8. The device according to claim 6, wherein the controller controls at least one of the second pump and the flow rate regulating valve based on the output from the sensor.

9. The device according to claim 5, wherein the second circulation system further includes a compressor, a second condenser, and an expansion valve, and the second refrigerant is supplied from the compressor to the heat exchanger via the second condenser and the expansion valve, and the second refrigerant is returned from the heat exchanger to the compressor.

10. The device according to claim 9, wherein the controller controls latent heat of vaporization of the second refrigerant in the heat exchanger.

11. The device according to claim 9, wherein the controller controls at least one of a temperature, a flow rate, and a pressure of the second refrigerant based on the output from the sensor.

12. The device according to claim 9, wherein the controller controls at least one of the compressor and the expansion valve based on the output from the sensor.

13. The device according to claim 9, wherein the second circulation system further includes a bypass path configured to bypass a main path from the compressor to the heat exchanger via the second condenser and the expansion valve, and a regulating valve is arranged in the bypass path.

14. The device according to claim 13, wherein the controller controls at least one of the compressor, the expansion valve, and the regulating valve based on the output from the sensor.

15. The device according to claim 13, wherein the heater includes a second heat exchanger, a third circulation path configured to branch from a path between the compressor and the second condenser and return to the compressor via the second heat exchanger is arranged, and a second regulating valve is arranged in the third circulation path.

16. A semiconductor manufacturing apparatus that includes a heat generating portion, the apparatus comprising:

a cooling device defined in claim 1, wherein the cooling device is configured to cool the heat generating portion by vaporizing a refrigerant in a vaporizer by heat from the heat generating portion.

17. The apparatus according to claim 16, wherein the apparatus is formed as a pattern formation apparatus configured to form a pattern.

18. A semiconductor manufacturing method comprising:

processing a substrate by a semiconductor manufacturing apparatus defined in claim 16; and processing the substrate processed in the processing.

19. The apparatus according to claim 3, wherein the second gas is one of air or an inert gas.

20. The apparatus according to claim 3, wherein the second gas is not chemically reactive with the refrigerant.

21. The apparatus according to claim 3, wherein the second gas maintains the refrigerant inside the vaporizer at a predetermined temperature and a predetermined saturated vapor pressure.

* * * * *